(12) United States Patent
Kim

(10) Patent No.: US 8,440,570 B2
(45) Date of Patent: May 14, 2013

(54) METHOD FOR MANUFACTURING SEMICONDUCTOR DEVICE

(75) Inventor: Cheol Kyun Kim, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 244 days.

(21) Appl. No.: 12/116,367

(22) Filed: May 7, 2008

(65) Prior Publication Data

US 2009/0111273 A1 Apr. 30, 2009

(30) Foreign Application Priority Data

Oct. 31, 2007 (KR) .......................... 10-2007-0110668

(51) Int. Cl.
*H01L 21/302* (2006.01)
(52) U.S. Cl.
USPC .............................. 438/717; 438/700; 438/702
(58) Field of Classification Search .................. 438/700, 438/702, 717
See application file for complete search history.

(56) References Cited

U.S. PATENT DOCUMENTS

| 2008/0057445 A1* | 3/2008 | Brueck et al. ................. 430/323 |
| 2008/0090419 A1* | 4/2008 | Koh et al. ..................... 438/696 |
| 2009/0035902 A1* | 2/2009 | Xu et al. ....................... 438/259 |
| 2009/0227091 A1* | 9/2009 | Sonsky et al. ................. 438/478 |

FOREIGN PATENT DOCUMENTS

| KR | 10-1996-0002762 | 2/1996 |
| KR | 1999-003882 | 1/1999 |
| KR | 10-2002-0036139 | 5/2002 |
| KR | 10-2005-0056355 | 6/2005 |

\* cited by examiner

*Primary Examiner* — Jae Lee
(74) *Attorney, Agent, or Firm* — Marshall, Gerstein & Borun LLP

(57) ABSTRACT

The invention defines a pillar pattern or an island pattern by forming a contact hole and filling the contact hole with a hard mask material by using a spacer formation process, so that the mask pattern formation process margin for island (e.g., pillar) pattern formation is increased. Accordingly, the yield and reliability of the formation process of a semiconductor device are improved.

10 Claims, 5 Drawing Sheets

METHOD FOR MANUFACTURING SEMICONDUCTOR DEVICE

CROSS-REFERENCE TO RELATED APPLICATION

The priority of Korean patent application number 10-2007-0110668, filed on Oct. 31, 2007, the disclosure of which is incorporated by reference in its entirety, is claimed.

BACKGROUND OF THE INVENTION

The invention relates to a method for manufacturing a semiconductor device using an island pattern.

The trend of ultra large-scale integration of semiconductor devices greatly influences the development of minute pattern forming technology. Particularly, the formation process of a photoresist pattern is very important in the formation process of semiconductor devices. Moreover, as the integration density of semiconductor devices has increased, processes for forming island patterns or pillar pattern and associated lithography technology have become very important.

Island patterns and pillar patterns are columnar type patterns or bar type patterns which are independently formed. In forming a photoresist pattern for forming island or pillar patterns, collapse of the photoresist pattern may occur.

The collapse of the photoresist pattern is usually manifested with one of two kinds of phenomena. Firstly, collapse of the pattern may be in the form of peeling, wherein the photoresist pattern falls off from the semiconductor substrate since the adhesion between the photoresist pattern and the semiconductor substrate is weak. Secondly, the photoresist pattern itself may be not be physically solid, so that the pattern is bent or broken.

The incidence of collapse of the photoresist pattern increases as the integration density of semiconductor devices increases since, because the aspect ratio of the photoresist pattern increases, and the thickness of the photoresist should be maintained or increased, the CD (critical dimension) of the photoresist pattern is reduced as the integration density increases.

In addition, in the wet development process, firstly the photoresist is treated by using a developing solution and washed with deionized water, and a spin dry method that rotates a wafer at high speed is performed. Collapse of the photoresist pattern occurs at the moment when the drying process begins.

At this time, collapse of the photoresist pattern occurs because of gravitational force acting on the central part of the gap between the patterns at the moment when deionized water (which was filled between patterns) abruptly evaporates while the spin dry process begins. As a result, weaker patterns collapse among the photoresist patterns.

The dry development process is advantageous in avoiding collapse of the photoresist pattern, in comparison with the wet development process. That is because the collapse of the photoresist pattern does not occur even in case of an aspect ratio with which the collapse of the photoresist pattern can occur in the dry development process.

However, as the aspect ratio is increased, collapse of the photoresist pattern can occur, since the limit of the process margin is reached, even in the dry development process.

Moreover, in the dry development process, the photoresist pattern may become bent or curved, even under conditions where the photoresist pattern does not fall out.

That is, the photoresist pattern is bent since atmospheric moisture coheres to the surface of the photoresist pattern when a wafer is exposed to the atmosphere after the dry development process is performed.

As described above, when the pillar pattern or the island pattern is formed, as the integration density of semiconductor devices is highly increased, the process margin for forming a photoresist pattern is more and more reduced. As a result, problems of decreased yield and lowered reliability due to the fault generation become very serious.

BRIEF SUMMARY OF THE INVENTION

Embodiments of the invention are directed to a method of forming an additional hard mask pattern, without directly forming the mask pattern for the island pattern or the pillar pattern formation with the photoresist pattern as in the related art. Further, such hard mask pattern is formed by using the process of contact hole formation and the spacer formation process.

According to an aspect of the invention, a method for manufacturing a semiconductor device comprises forming a sacrificial layer pattern that exposes an island pattern region on an underlying layer formed on a semiconductor substrate; filling the island pattern region with an insulating material for hard mask by using a spacer formation process; forming a hard mask pattern by removing the sacrificial layer pattern; and forming the island pattern by etching the underlying layer using the hard mask pattern.

In accordance with an embodiment of the invention, a method for manufacturing a semiconductor device preferably further includes forming a hard mask layer between the underlying layer and the sacrificial layer pattern. The hard mask layer preferably comprises an a-C (amorphous carbon) layer. The hard mask layer may comprise a stacking structure of an a-C layer and an SiON layer. The sacrificial layer pattern is preferably an oxide layer pattern, and the island pattern is preferably a pillar pattern.

According to another aspect of the invention, a method for manufacturing a semiconductor device comprises forming a first hard mask layer on an underlying layer formed on a semiconductor substrate; forming a mask pattern that exposes an island pattern region on the first hard mask layer; filling the exposed island pattern region with a second hard mask material by using a spacer formation process; forming a second hard mask pattern by removing the mask pattern; forming a first hard mask pattern by etching the first hard mask layer with the second hard mask pattern as an etch mask; and forming the island pattern by etching the underlying layer with the first and the second hard mask patterns as an etch mask.

The first hard mask layer preferably comprises an a-C layer. The first hard mask layer may comprise a stacking structure of an a-C layer and an SiON layer. The second hard mask material is preferably one of a polysilicon layer and a TEOS film. The mask pattern is preferably an oxide layer pattern. The island pattern is preferably a pillar pattern.

DESCRIPTION OF EMBODIMENTS

FIGS. 1a to 1f are cross-sectional views showing a method for manufacturing a semiconductor device.

Figure 1A:
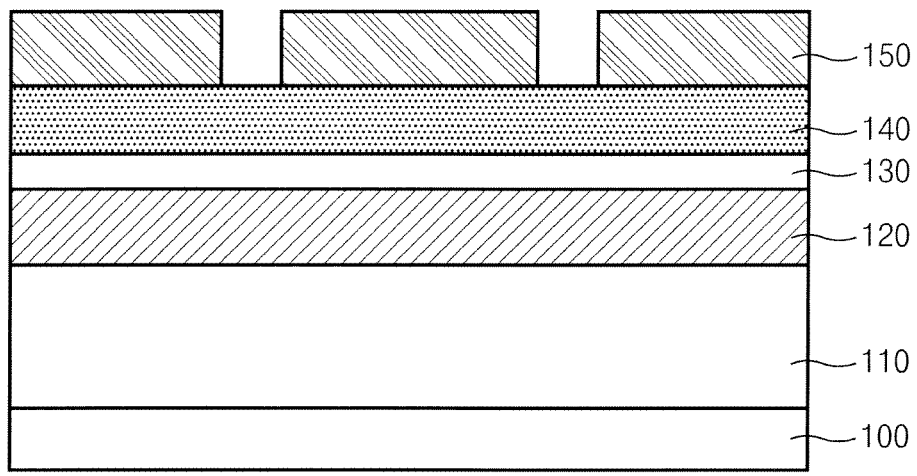
FIGS. 1a to 1f are cross-sectional views showing a method for manufacturing a semiconductor device.

Referring to FIG. 1a, an underlying layer 110 for a pillar pattern or an island pattern formation is formed on a semiconductor substrate 100.

An a-C (amorphous carbon) layer 120 is formed on the underlying layer 110 as a first hard mask material. At this time, the a-C layer 120 is mainly used in the minute patterning process since it can fully perform the function as a hard mask with a small thickness. However, since the step coverage of the a-C layer 120 is inferior to other materials, defects in the a-C layer 120 can be complemented by additionally forming an SiON layer 130 on the a-C layer 120.

An oxide layer 140 for second hard mask pattern formation is formed on the SiON layer 130.

A photoresist pattern 150 exposing the pillar pattern or the island pattern region in the air is formed on the oxide layer 140.

Figure 1B:
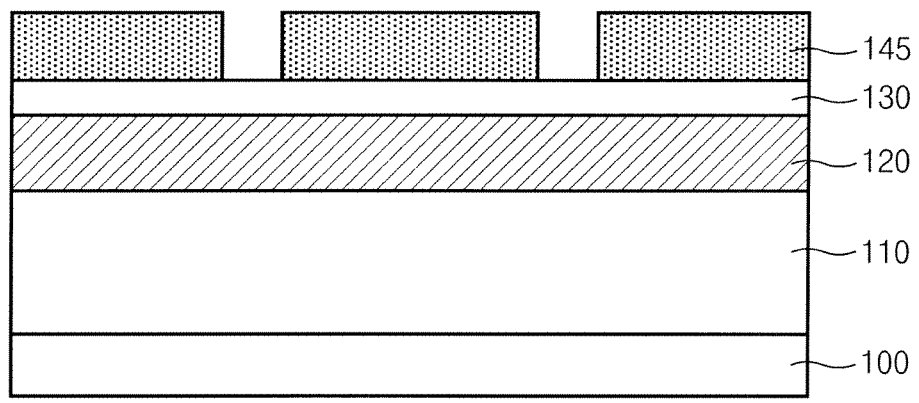

Referring to FIG. 1b, the oxide layer 140 is etched by using the photoresist pattern 150 as a mask, and an oxide layer pattern 145 exposing the pillar pattern or the island pattern region in the air is formed.

Then, the photoresist pattern 150 is removed.

Figure 1C:
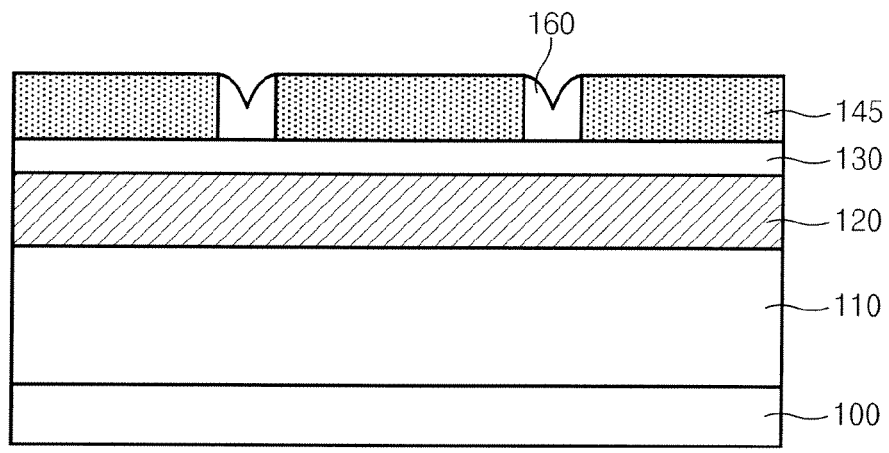

Referring to FIG. 1c, a second hard mask material is filled into the region between the oxide layer patterns 145. At this time, it is preferable that one of a polysilicon layer and a TEOS (tetra ethyl ortho silicate) film is used as a second hard mask material. The gap fill process is carried out using a spacer formation process. At this time, the spacer formation process is used in order that the region between the oxide layer patterns 145 is not completely filled as shown in FIG. 1c.

Here, the thickness of the polysilicon layer or the TEOS film used as a second hard mask material can be easily controlled. Therefore, the thickness is controlled in such a manner that the region between the oxide layer patterns 145 can be filled while performing the spacer formation process. Therefore, the region between the oxide layer patterns 145 can be filled with a minimum effort.

Then, an etch-back or CMP (chemical mechanical polishing) process is performed to remove the polysilicon layer or the TEOS film formed on the oxide layer pattern 145, so that a second hard mask pattern 160 is formed.

Figure 1D:
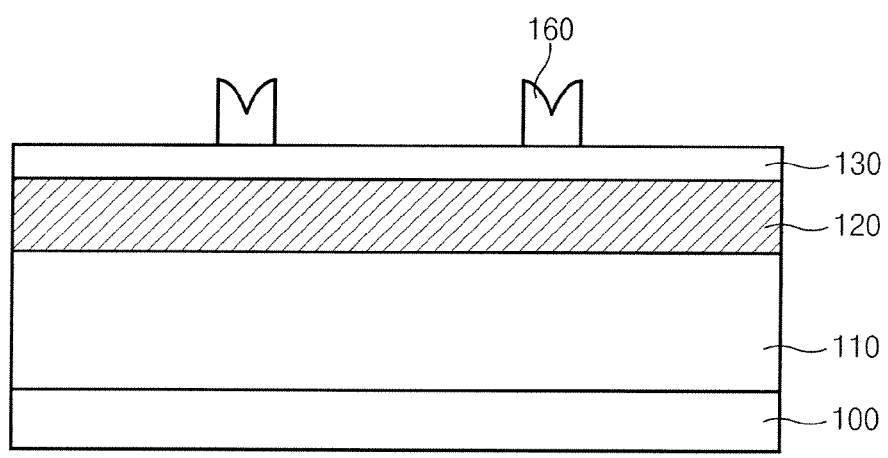

Referring to FIG. 1d, the oxide layer pattern 145 is removed. Therefore, the remained second hard mask pattern 160 becomes the mask pattern defining the pillar pattern or the island pattern.

Figure 1E:
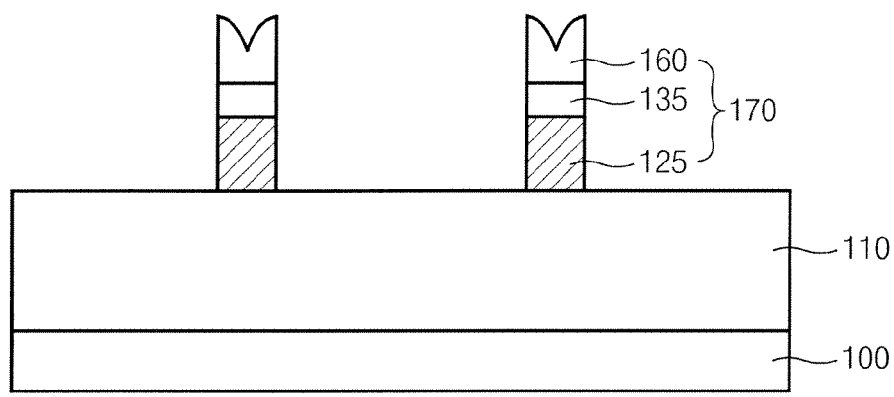

Referring to FIG. 1e, the SiON layer 130 and the a-C layer 120 are sequentially etched by using the second hard mask pattern 160 as an etch mask, so that an SiON pattern 135 and an a-C pattern 125 defining the pillar pattern or the island pattern are formed.

The a-C pattern 125, the SiON pattern 135, and the second hard mask pattern 160 become a mask pattern 170 defining the pillar pattern or the island pattern.

As described above, by forming the mask pattern 170 using a spacer formation process, the mask pattern 170 can be formed with a minute size without the problem of the collapse or the damage of the mask pattern 170.

Figure 1F:
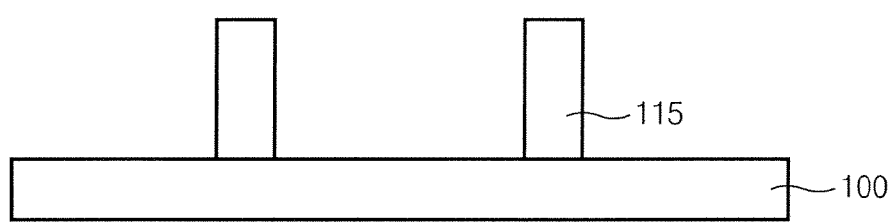

Referring to FIG. 1f, the underlying layer 110 is etched by using the mask pattern 170.

The underlying layer pattern etched like this becomes the pillar pattern or an island pattern 115.

Then, the mask pattern 170 is removed.

Figure 2A:
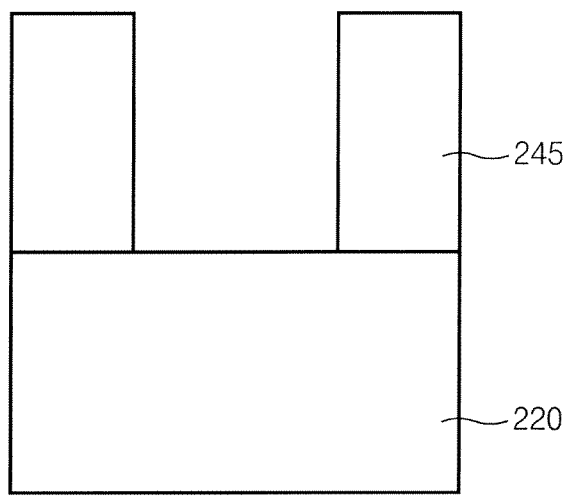
FIGS. 2a to 2c are cross-sectional views for showing a method of forming a hard mask pattern by using the spacer formation process.
Figure 2B:
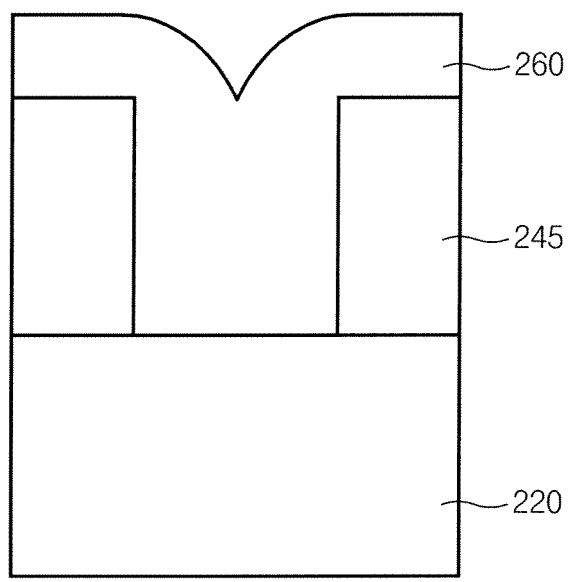
Figure 2C:
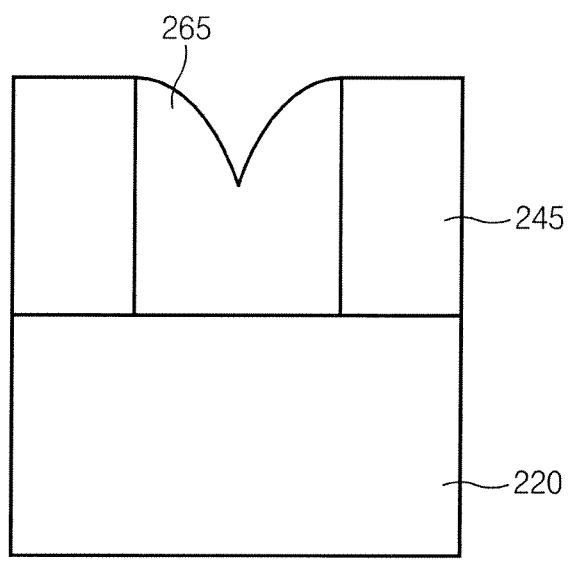

FIGS. 2a to 2c are cross-sectional views for showing a method of forming a hard mask pattern by using the spacer formation process in detail.

Referring to FIG. 2a, an oxide layer pattern 245 exposing a pillar pattern or an island pattern region in the air is formed on a first hard mask layer 220.

Referring to FIG. 2b, a second hard mask material 260 is formed on the resultant structure of FIG. 2a. At this time, the second hard mask material 260 formation process uses the spacer formation process. Usually, a polysilicon is used in the spacer formation process. Therefore, the polysilicon can be used as a second hard mask material 260. Moreover, it is preferable that the a-C layer is used for the second hard mask material 260 since the second hard mask material 260 must be a material having a large etch selectivity with respect to the underlying layer.

Referring to FIG. 2c, the etch-back process is performed to form a second hard mask pattern 265 defining the pillar pattern or the island pattern. At this time, a CMP (chemical mechanical polishing) process can used in case the etch back process is not facilitated.

As described above, the method of the invention, which forms a mask pattern for the pillar pattern or the island pattern formation of a minute size, in case of forming the hard mask pattern by directly defining, the lithographic process margin is reduced. Therefore, the contact hole formation process, which has a better process margin than the columnar pattern formation process is used, so that the spacer formation process that fills the contact hole is used. Accordingly, the pillar pattern or the island process for pattern formation is readily performed.

The formation method of semiconductor devices according to the invention defines the pillar pattern or the island pattern by using the contact hole formation process. The inside of the contact hole is filled with a hard mask material by using the spacer formation process, so that the process margin for mask pattern formation for forming the pillar pattern or the island pattern can be increased. Accordingly, the effect of improving the yield and the reliability of the process of semiconductor device formation is provided.

Various modifications and variation can be made in the invention without departing from the spirit or scope of the invention. Thus, it is intended that the invention cover the modifications and variations of this invention provided they come within the scope of the appended claims and their equivalents.

What is claimed is:

1. A method for manufacturing a semiconductor device, comprising:
    forming a sacrificial layer pattern having a hole defining an island pattern region on an underlying layer, wherein the island pattern region is a region where a target pattern is to be formed;
    performing a gap fill process to fill the hole with a hard mask insulating material to form a single pillar defining the target pattern in the hole;
    forming a hard mask pattern by removing the sacrificial layer pattern; and
    forming the target pattern by etching the underlying layer using the hard mask pattern, wherein a width of the target pattern is same as a width of the hole.

2. The method of claim 1, further comprising forming a hard mask layer between the underlying layer and the sacrificial layer pattern.

3. The method of claim 2, wherein the hard mask layer comprises an a-C (amorphous carbon) layer.

4. The method of claim 2, wherein the hard mask layer comprises a stacking structure of an a-C (amorphous carbon) layer and an SiON layer.

5. The method of claim 1, wherein the sacrificial layer pattern is an oxide layer pattern.

6. A method for manufacturing a semiconductor device, comprising:

forming a hard mask layer on an underlying layer;

forming a mask pattern having a hole defining an island pattern region on the hard mask layer, wherein the island pattern region is a region where a target pattern is to be formed;

performing a gap fill process to fill the hole with a hard mask material to form a single pillar defining the target pattern in the hole;

forming a second hard mask pattern by removing the mask pattern;

forming a first hard mask pattern by etching the first hard mask layer using the second hard mask pattern as an etch mask; and forming the target pattern by etching the underlying layer with the first hard mask pattern as an etch mask, wherein a width of the target pattern is same as a width of the hole.

7. The method of claim 6, wherein the first hard mask layer comprises an a-C (amorphous carbon) layer.

8. The method of claim 6, wherein the first hard mask layer comprises a stacking structure of an a-C (amorphous carbon) layer and an SiON layer.

9. The method of claim 6, wherein the hard mask material is selected from the group consisting of polysilicon layers and tetra ethyl ortho silicate (TEOS) films.

10. The method of claim 6, wherein the mask pattern is an oxide layer pattern.

* * * * *